United States Patent
Nakayama et al.

(10) Patent No.: US 10,032,650 B2
(45) Date of Patent: Jul. 24, 2018

(54) DIE MOUNTING SYSTEM AND DIE MOUNTING METHOD

(71) Applicant: FUJI MACHINE MFG. CO., LTD., Chiryu (JP)

(72) Inventors: Yukinori Nakayama, Hekinan (JP); Kenji Nakai, Chiryu (JP); Satoshi Yoshioka, Nagoya (JP)

(73) Assignee: FUJI MACHINE MFG. CO., LTD., Chiryu (JP)

( * ) Notice: Subject to any disclaimer, the term of this patent is extended or adjusted under 35 U.S.C. 154(b) by 0 days.

(21) Appl. No.: 15/128,836

(22) PCT Filed: Mar. 24, 2014

(86) PCT No.: PCT/JP2014/058026
§ 371 (c)(1),
(2) Date: Sep. 23, 2016

(87) PCT Pub. No.: WO2015/145531
PCT Pub. Date: Oct. 1, 2015

(65) Prior Publication Data
US 2017/0110342 A1    Apr. 20, 2017

(51) Int. Cl.
*H01L 21/52* (2006.01)
*H01L 21/67* (2006.01)
(Continued)

(52) U.S. Cl.
CPC .......... *H01L 21/52* (2013.01); *B23K 1/0016* (2013.01); *B23K 3/08* (2013.01);
(Continued)

(58) Field of Classification Search
None
See application file for complete search history.

(56) References Cited

U.S. PATENT DOCUMENTS

| | | | |
|---|---|---|---|
| 2008/0104831 A1 | 5/2008 | Haji et al. | |
| 2011/0162189 A1* | 7/2011 | Noda | H01L 21/67144 29/428 |
| 2011/0280691 A1* | 11/2011 | Yabe | B25J 9/0084 414/222.01 |

FOREIGN PATENT DOCUMENTS

| | | |
|---|---|---|
| JP | 2005-251978 A | 9/2005 |
| JP | 2010-129949 A | 6/2010 |

(Continued)

OTHER PUBLICATIONS

Extended Search Report dated Jan. 31, 2017 in European Patent Application No. 14886703.9.
(Continued)

*Primary Examiner* — Seahvosh Nikmanesh
*Assistant Examiner* — Xiaoming Liu
(74) *Attorney, Agent, or Firm* — Oblon, McClelland, Maier & Neustadt, L.L.P.

(57) ABSTRACT

A die mounting system in which die supply device is set on component mounter and dies supplied from die supply device are mounted on circuit board by mounting head of component mounter, determines the next die transfer position is determined such that the longer of time required for die transfer preparation operation (die imaging and image processing, die pickup operation, and movement and vertical inverting operation of a supply head) of die supply device and time required for die mounting operation (movement and vertical motion at the mounting position of mounting head) of component mounter is made shorter, and the difference (which corresponds to the waiting time at the die transfer position) between the two times decreased, such that the cycle time is shortened.

5 Claims, 16 Drawing Sheets

(51) Int. Cl.
    *H05K 13/02*     (2006.01)
    *H05K 13/04*     (2006.01)
    *B23K 1/00*     (2006.01)
    *B23K 3/08*     (2006.01)
    *H01L 21/677*     (2006.01)

(52) U.S. Cl.
    CPC .. *H01L 21/67144* (2013.01); *H01L 21/67745* (2013.01); *H05K 13/043* (2013.01)

(56) References Cited

FOREIGN PATENT DOCUMENTS

| | | | |
|---|---|---|---|
| JP | 2011-235411 A | | 11/2011 |
| JP | 2012-23230 A | | 2/2012 |
| JP | 2012023230 A | * | 2/2012 |
| WO | WO 2005/101943 A2 | | 10/2005 |

OTHER PUBLICATIONS

International Search Report dated Jun. 3, 2014, in PCT/JP2014/58026 filed Mar. 24, 2014.
Office Action dated Dec. 15, 2017 in Japanese Patent No. 2016-509631 (with English Translation).

* cited by examiner

During die pickup operation

During vertical inverting operation

US 10,032,650 B2

DIE MOUNTING SYSTEM AND DIE MOUNTING METHOD

TECHNICAL FIELD

This application relates to a die mounting system and die mounting method in which a die supply device that supplies dies formed from a single diced wafer is set on a component mounter, and dies supplied from the die supply device are picked up by a mounting head of the component mounter and mounted on a circuit board.

BACKGROUND ART

In recent years, as disclosed in patent literature 1 (JP-A-2010-129949), there are items in which a die supply device that supplies dies is set on a component mounter, and dies supplied from the die supply device are picked up by a mounting head of the component mounter and mounted on a circuit board. This die supply device is provided with a magazine that houses multiple levels of wafer pallets on which is an expanded dicing sheet affixed with a wafer that has been diced into multiple dies, and a supply head that picks up the dies from the dicing sheet on the wafer pallet, with the configuration being such that wafer pallets are pulled out from the magazine one at a time and dies picked up by the supply head from the dicing sheet on the wafer pallet.

However, dies are formed by dicing a single wafer affixed to a dicing sheet, and there are cases in which the wafer is affixed to the dicing sheet with the mounting surface of the dies facing up. Thus, with the component mounter disclosed in patent literature 2 (JP-A-2012-23230), the supply head of the die supply device is configured to vertically invert, and after die pickup operation, the supply head is inverted such that dies held by the supply head are picked up by the mounting head of a component mounter and mounted on a circuit board.

CITATION LIST

Patent Literature

Patent Literature 1: JP-A-2010-129949
Patent Literature 1: JP-A-2012-23230

SUMMARY

However, when comparing the time required, after the completion of die transfer operation of picking up a die held by the supply head of the die supply device with the mounting head of the component mounter, for die transfer preparation operation of inverting the supply head of the die supply device to its original state and moving the supply head above a die which is to be a pickup target, picking up the die, vertically inverting again, and moving to the next die transfer position, and the time required, after the completion of die transfer operation, for die mounting operation of moving the mounting head of the component mounter above the die mounting position on the circuit board, mounting the die on the circuit board, and moving the mounting head to the next die transfer position, the two times are not the same, so the head that arrives at the next die transfer position earlier must wait for the other head to arrive. Also, because the cycle time is decided by the total of the time taken for die transfer operation (time taken for die transfer operation is taken as a fixed time) and the longer of the time required for die transfer preparation operation of the die supply device and the time required for die mounting operation of the component mounter (=shorter time+waiting time), in order to shorten cycle time and improve productivity, it is necessary to shorten the longer time or the waiting time.

An object of the present disclosure is to solve the above problem by providing a die mounting system and die mounting method that enable the cycle time to be shortened and thus productivity to be increased.

To achieve the above object, the present disclosure is a die mounting system including: a die supply device that supplies dies formed from a single diced wafer affixed to a dicing sheet and that is set on a component mounter, the die supply device including a supply head that picks up a die from the dicing sheet and is then vertically inverted, and a supply head moving mechanism that moves the supply head; a mounting head of the component mounter that picks up a die supplied from the die supply device and mounts the die on a circuit board; and a control system that controls operation such that the supply head is moved above the die which is to be the pickup target by the supply head moving mechanism, the die is picked up by the supply head, the supply head is vertically inverted, the supply head is moved to a die transfer position by the supply head moving mechanism, and the die held by the supply head is picked up by the mounting head of the component mounter at the transfer position and mounted on a circuit board, wherein the control system sets a next die transfer position such that cycle time is shortened by the longer of two times being made shorter and the time difference of the two times being made smaller, the two times being the time required, after the completion of die transfer operation of picking up a die held by the supply head of the die supply device with the mounting head of the component mounter at the die transfer position, for die transfer preparation operation of inverting the supply head of the die supply device to its original state and moving the supply head above a die which is to be a pickup target, picking up the die, vertically inverting again, and moving to the next die transfer position, and the time required, after the completion of die transfer operation, for die mounting operation of moving the mounting head of the component mounter above the die mounting position on the circuit board, mounting the die on the circuit board, and moving the mounting head to the next die transfer position.

Effects

With this configuration, because the next die transfer position is set such that the cycle time is shortened by shortening the longer of the time required for die transfer preparation operation of the die supply device and the time required for die mounting operation of the component mounter and making the difference between the two times smaller (this corresponds to the waiting time at the die transfer position), the cycle time is shortened, thus improving productivity.

Forms of the Disclosure

However, although die transfer preparation operation of the die supply device includes supply head movement, die pickup operation, and vertical inverting operation, the time required for die pickup operation and vertical inverting operation of the supply head can be taken as a fixed time that is independent of the die transfer position, therefore the time required for die transfer preparation operation of the die supply device is correlated with the supply head movement time. Thus, the supply head movement time may be used as representative information of the time required for die transfer preparation operation of the die supply device.

Also, although die mounting operation of the component mounter includes mounting head movement and vertical motion at the mounting position, the time required for vertical motion at the mounting position can be taken as a fixed time that is independent of the die transfer position, therefore the time required for die mounting operation of the component mounter is correlated with the mounting head movement time. Thus, the mounting head movement time may be used as representative information of the time required for die mounting operation of the component mounter.

When realizing the present disclosure, multiple provisional die transfer positions may be prepared as candidates for the next die transfer position, and, under each of the provisional die transfer positions, the time required for die transfer preparation operation of the die supply device or information equivalent to that, and the time required for die mounting operation of the component mounter or information equivalent to that calculated, and the next die transfer position decided as the provisional die transfer position that results in the shortest cycle time.

DESCRIPTION OF EMBODIMENTS

Figure 1:
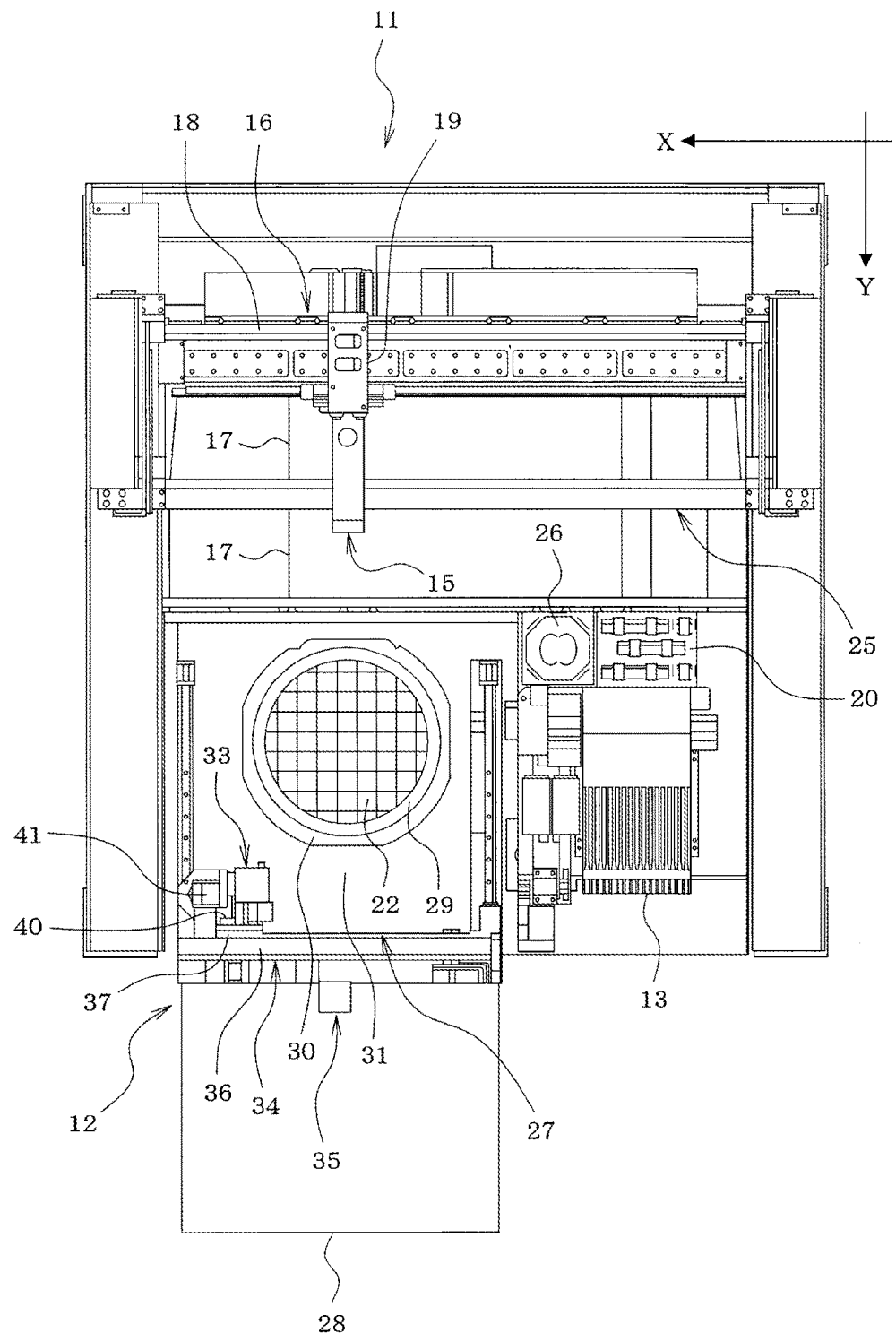
FIG. 1 is a plan view of a die supply device set in a component mounter of an embodiment of the present disclosure.
Figure 2:
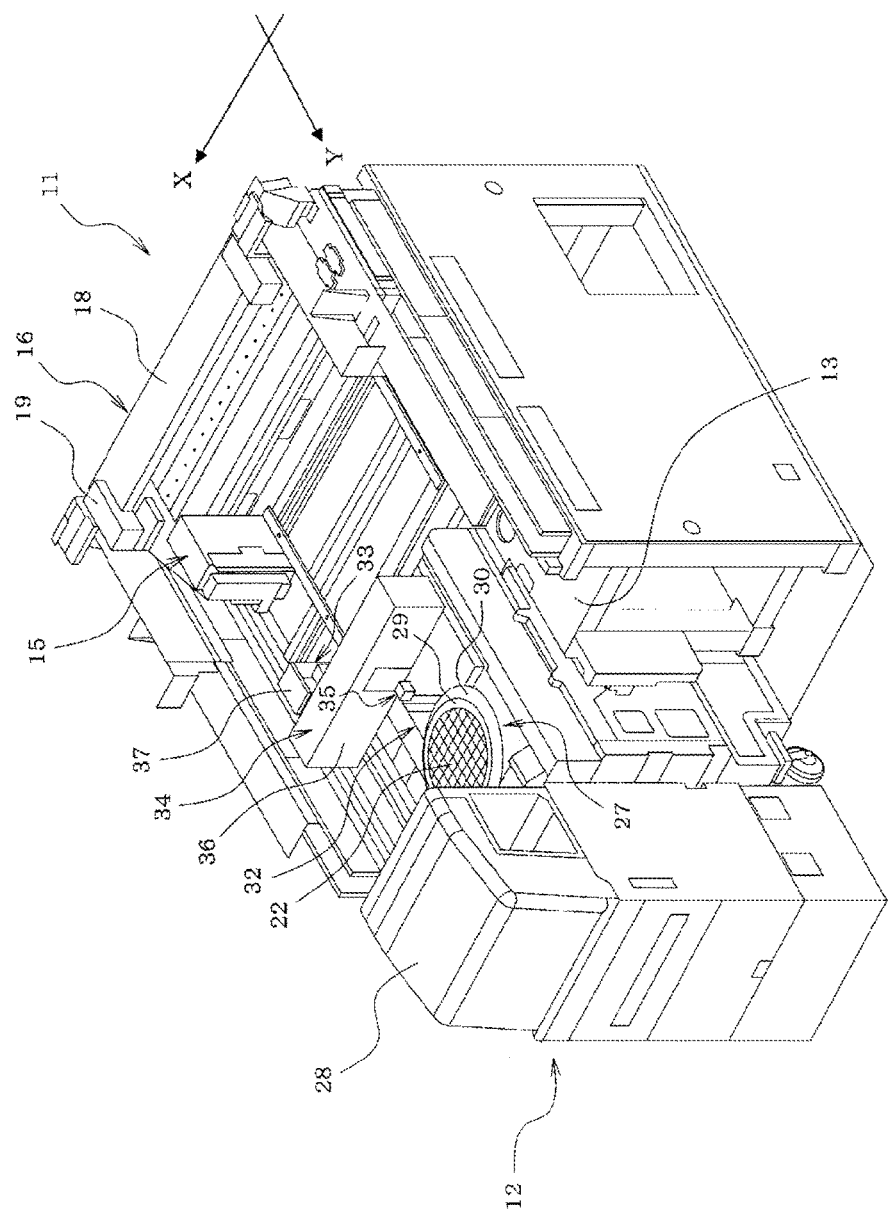
FIG. 2 is a perspective view showing the die supply device set in the component mounter.
Figure 3:
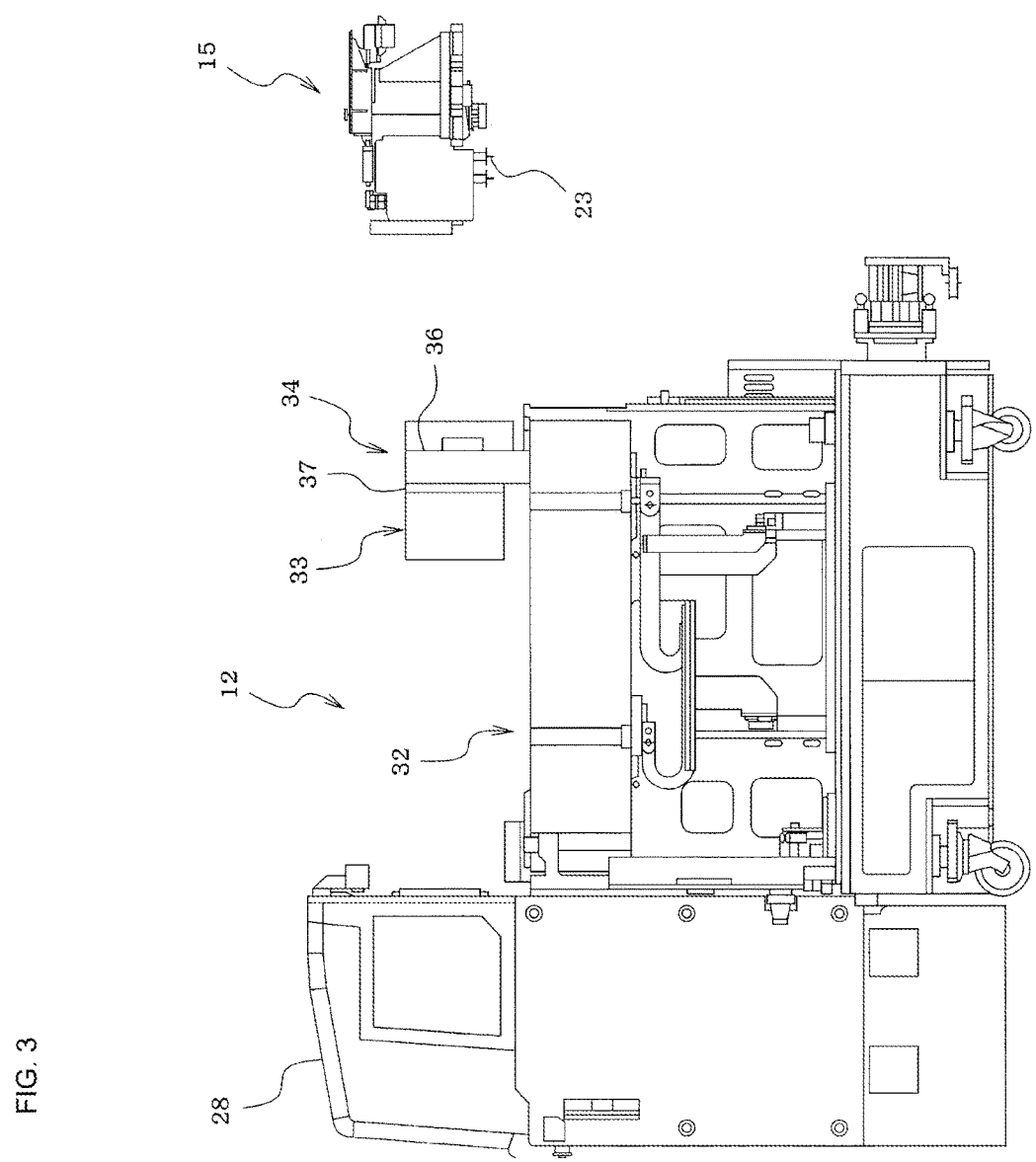
FIG. 3 is a side view showing the positional relationship between the mounting head of the component mounter and the die supply device when the die supply device is set in the component mounter.
Figure 4:
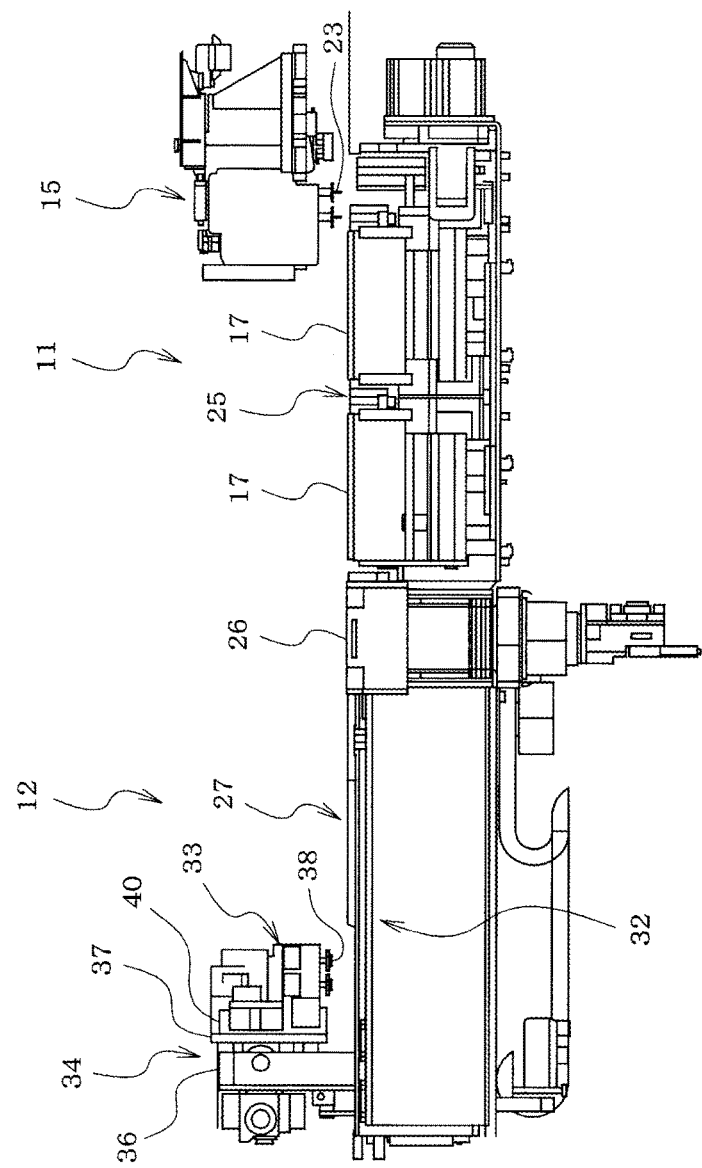
FIG. 4 is a side view showing the height positional relationship between the mounting head of the component mounter and the supply head when the stage of the die supply device is raised.

An embodiment of the present disclosure is described below with reference to the drawings. As shown in FIG. 1 and FIG. 2, die supply device 12 is detachably set in component mounter 11. In component mounter 11, feeder setting table 13 is provided adjacent to a set position of die supply device 12, and a feeder (not shown) such as a tape feeder is detachably set on feeder setting table 13. Feeders set on feeder setting table 13 are not limited to tape feeders; feeder may be a bulk feeder, a stick feeder, and the like, and multiple types of feeders among thereof may be set on feeder setting table 13.

Component mounter 11 is provided with XY moving mechanism 16 (XY robot) that moves mounting head 15 in XY-directions (right-left and front-rear directions). XY moving mechanism 16 includes Y slide 18 that slides in a Y-direction (a direction perpendicular to a conveyance direction of circuit board 17) and X slide 19 that is supported on Y slide 18 so as to be slidable in an X-direction (the conveyance direction of circuit board 17); mounting head 15 is supported on X slide 19.

Mounting head 15 of component mounter 11 is provided with one or multiple suction nozzles 23 (refer to FIGS. 3 to 8) that pick up a die 22 supplied from die supply device 12 or an electronic component (hereinafter referred to as a "feeder component") supplied from a feeder, a mark camera (not shown) that images an imaging target such as a fiducial mark of circuit board 17 from above, and the like. Mounting head 15 is exchangeable with a mounting head having a different number of suction nozzles 23.

Component mounter 11 is provided with two conveyors 25 that convey circuit board 17 lined up next to each other, and part camera 26 (refer to FIG. 1 and FIGS. 4 to 8) that images die 22 or the feeder component which has been picked up by suction nozzle 23 of mounting head 15 from below is provided facing upward at a position between conveyors 25 and die supply device 12 (or the feeder). Also, nozzle station 20 (refer to FIG. 1) that stores suction nozzles for exchange is provided on component mounter 11, such that a suction nozzle 23 held on mounting head 15 can be automatically exchanged with a suction nozzle stored in nozzle station 20.

Figure 12:
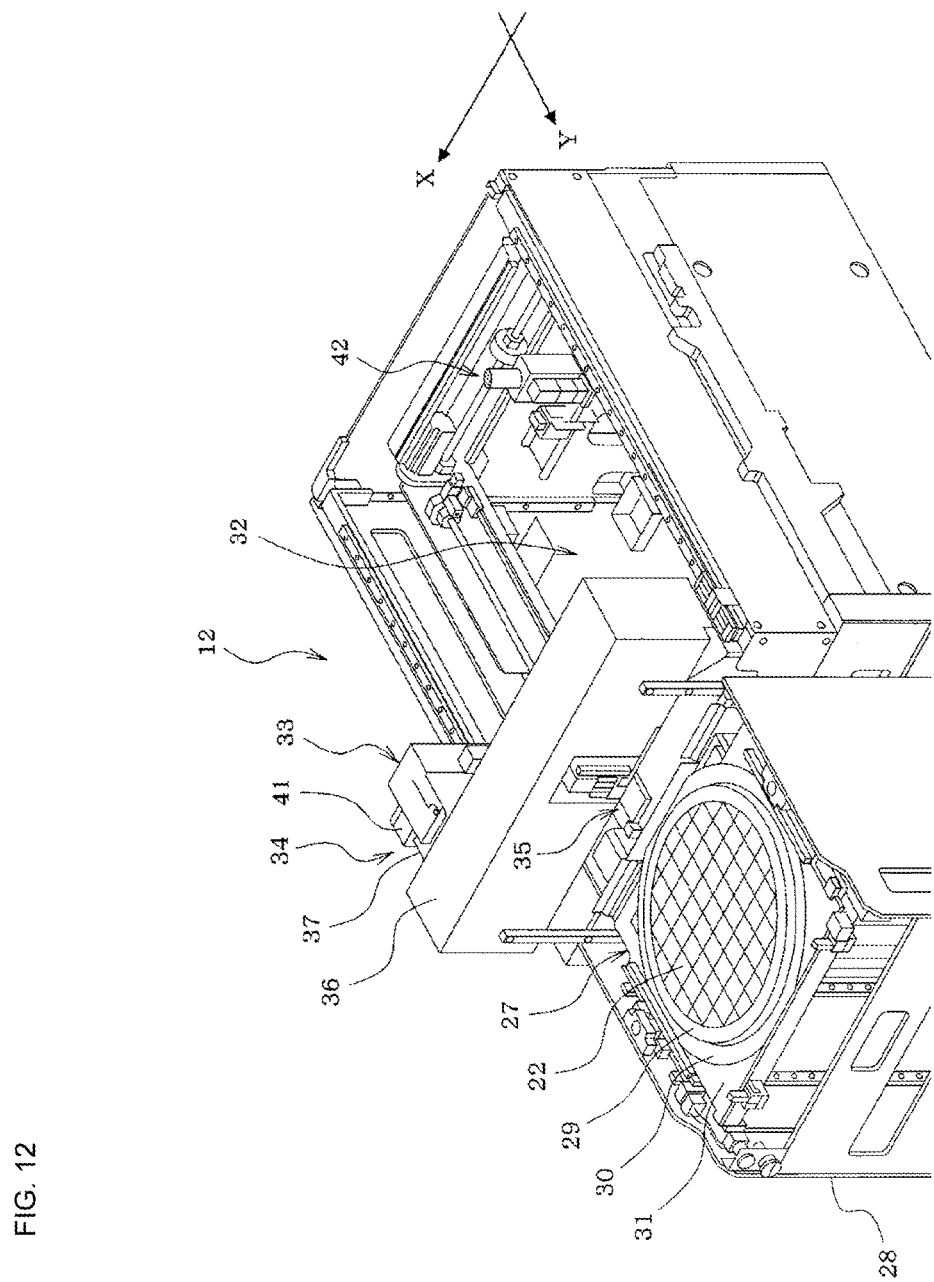
FIG. 12 is a perspective view from diagonally above showing the state in which a wafer pallet has not been pulled out from the magazine of the die supply device onto the stage.
Figure 13:
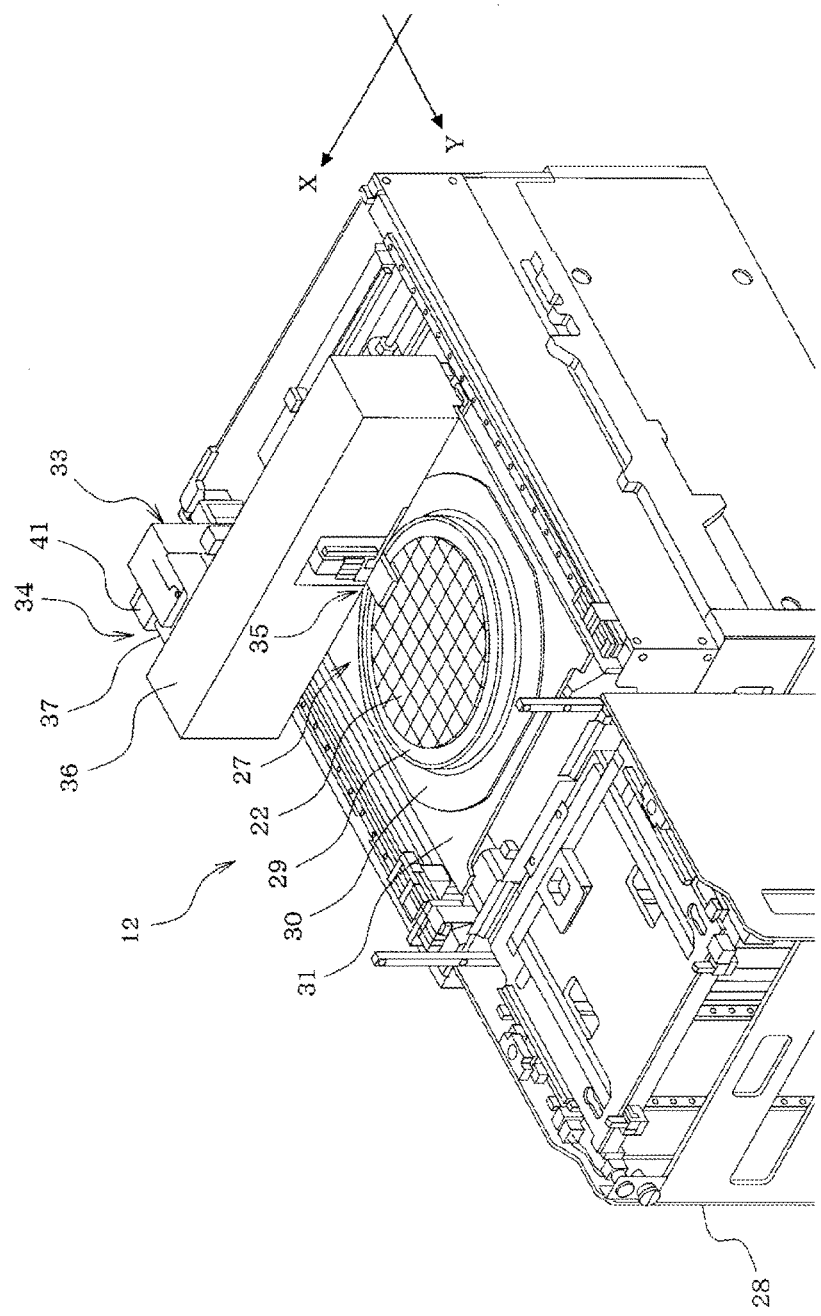
FIG. 13 is a perspective view from diagonally above showing the state in which a wafer pallet has been pulled out from the magazine of the die supply device onto the stage.

Meanwhile, die supply device 12 is provided with magazine 28 that houses wafer pallets 27 at multiple levels. As shown in FIG. 12 and FIG. 13, wafer pallet 27 is configured such that elastic dicing sheet 29 attached with a wafer diced so as to be divided into many dies 22 is mounted in an expanded state on dicing frame 30 that has a circular opening portion, and dicing frame 30 is attached to pallet main body 31 by screw clamps or the like. Pallet pulling out and returning mechanism 35 is provided on die supply device 12, and wafer pallet 27 is pulled out onto stage 32 and returned into magazine 28 by pallet pulling out and returning mechanism 35.

Figure 9:
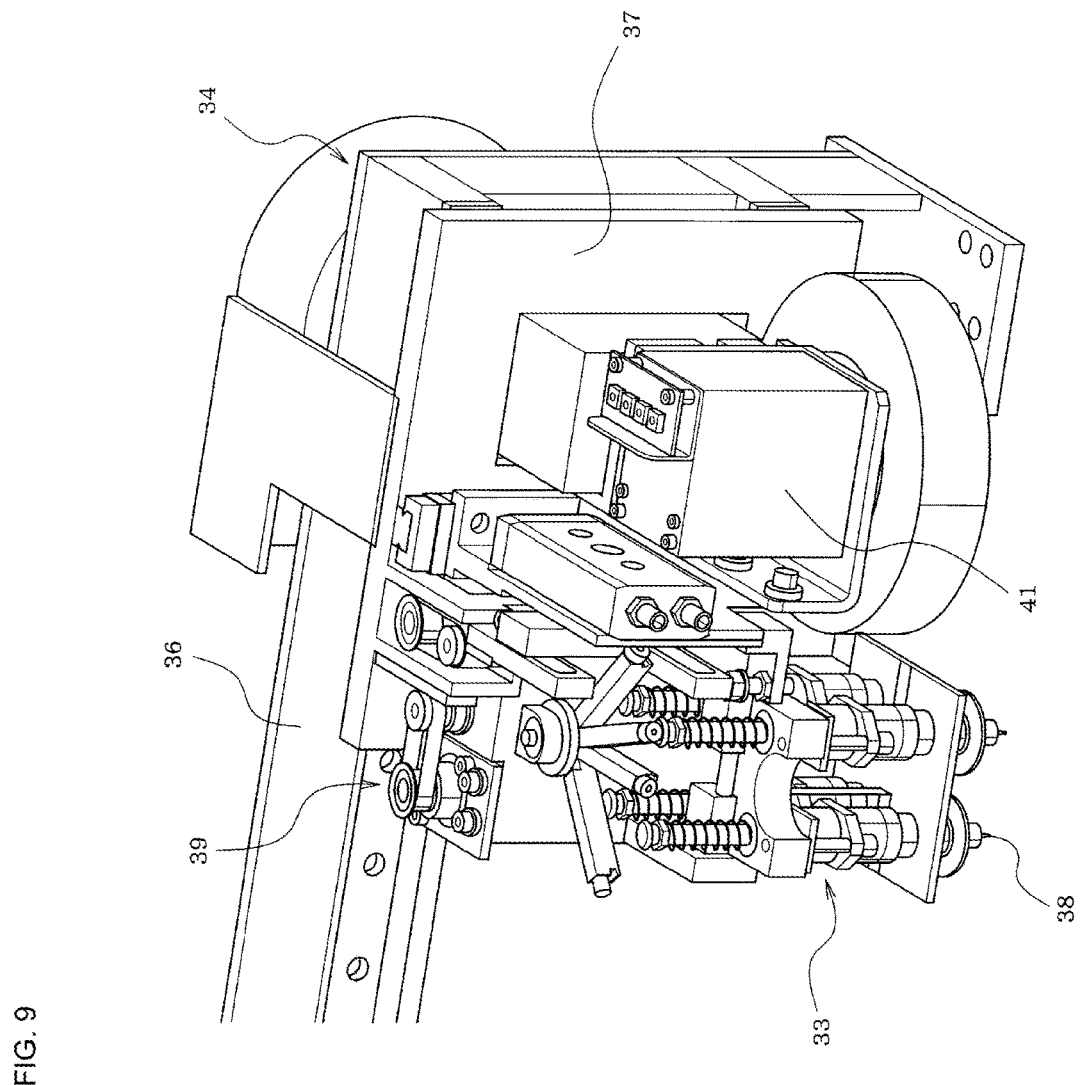
FIG. 9 is a perspective view showing the positional relationship of the camera and the supply head of the die supply device.
Figure 10:
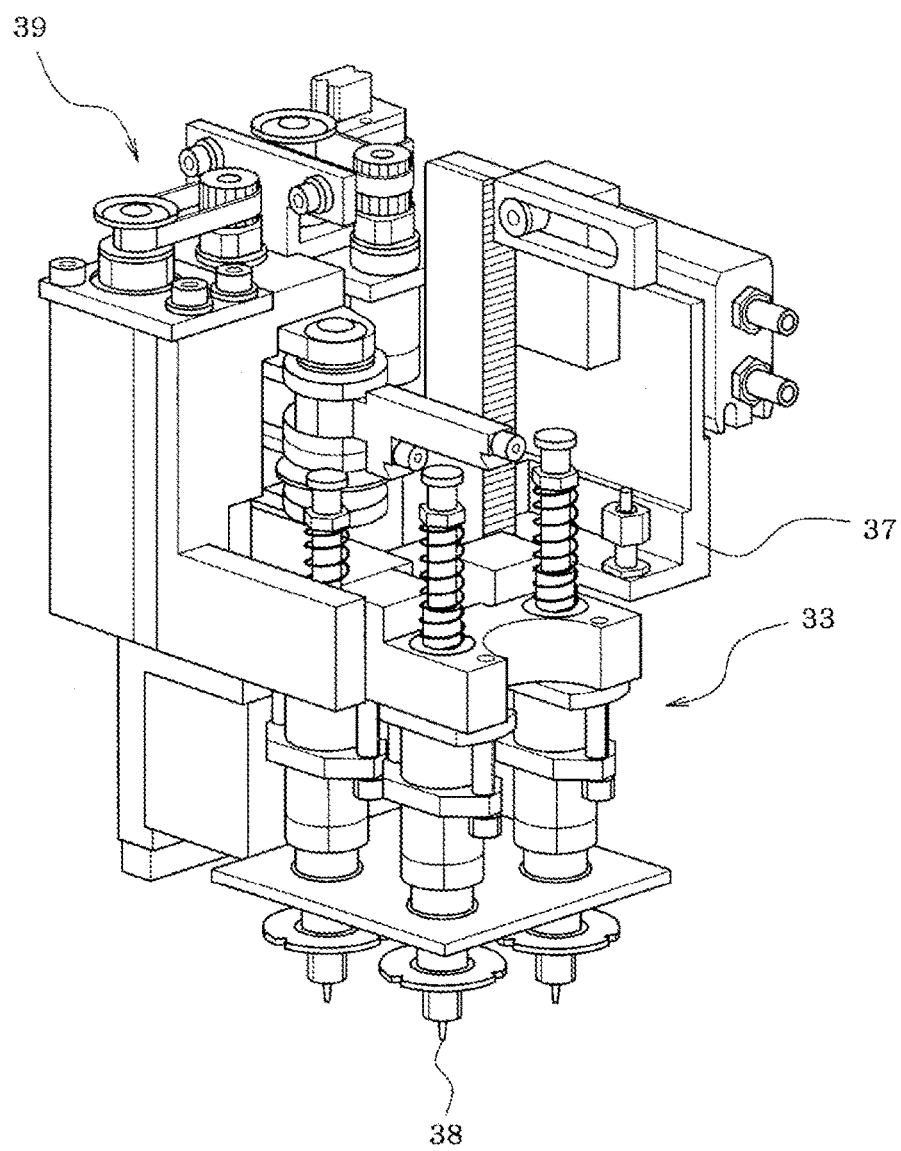
FIG. 10 is a perspective view showing the state of the supply head during die pickup operation.
Figure 11:
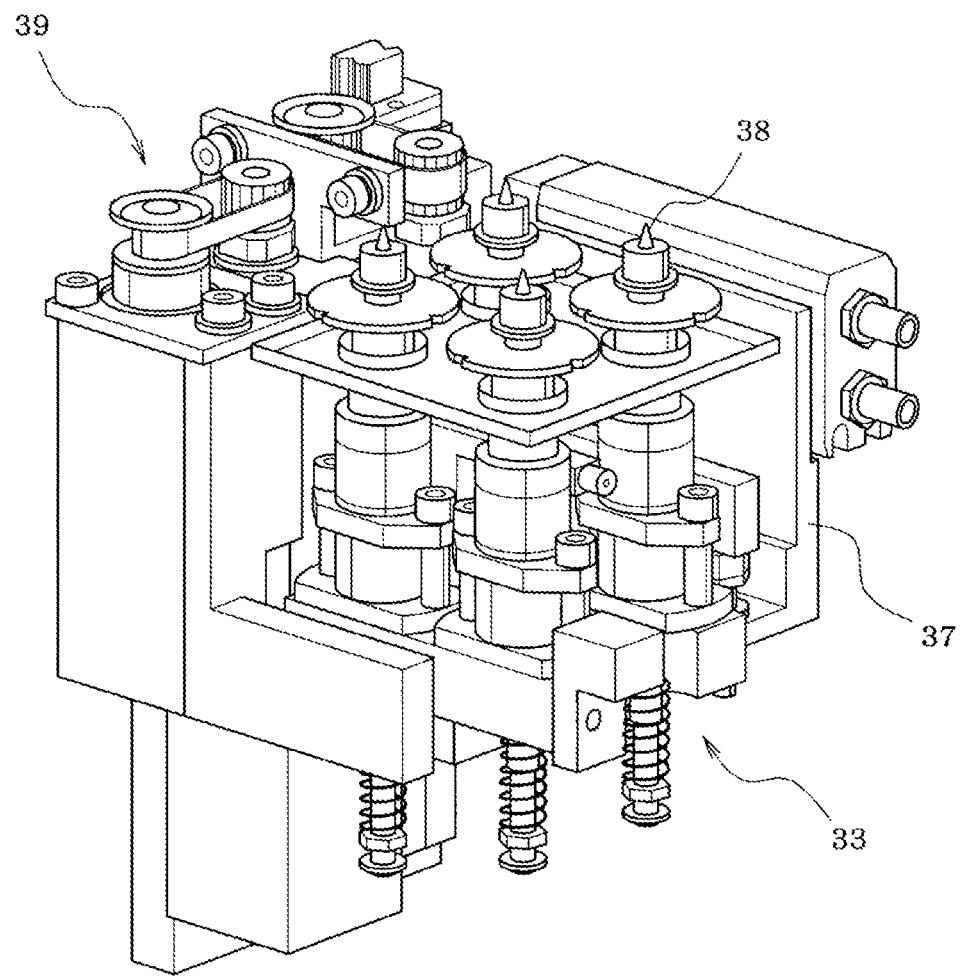
FIG. 11 is a perspective view showing the state of the supply head during vertical inverting operation.

Also, die supply device 12 is provided with supply head moving mechanism 34 (XY robot) that moves supply head 33 in the XY-directions (the right-left and front-rear directions). Supply head moving mechanism 34 includes Y slide 36 that slides in the Y-direction, and X slide 37 that is supported on Y slide 36 so as to be slidable in the X-direction; supply head 33 is detachably held by head holding unit 40 that is provided on X slide 37; one or multiple suction nozzles 38 (refer to FIGS. 9 to 11) are held by supply head 33 so as to be vertically movable. Supply head 33 of die supply device 12 is used when die 22 is attached on dicing sheet 29 of wafer pallet 27 with the mounting surface facing upward and is configured such that, after die 22 has been picked up by suction nozzle 38 of the supply head 33, the supply head 33 is inverted by vertical inverting mechanism 39 (refer to FIGS. 9 to 11), thereby flipping die 22 so as to be picked up by suction nozzle 23 of mounting head 15 of component mounter 11.

Figure 7:
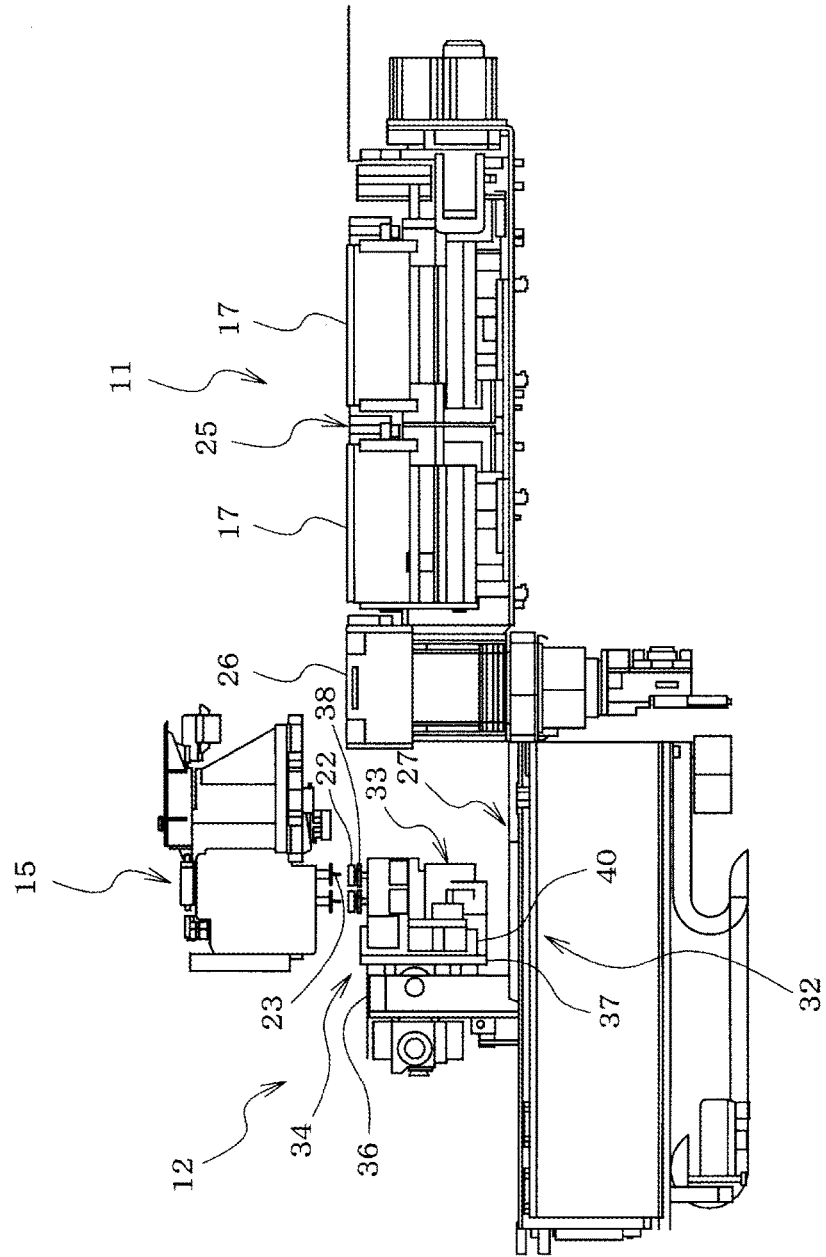
FIG. 7 is a side view showing the state when dies held by the supply head that has been vertically inverted are picked up by the mounting head of the component mounter.

In this case, since the height position of die 22 on the inverted supply head 33 must be adjusted to the pickup height position of mounting head 15 of component mounter 11, an up-down moving mechanism (not shown) which moves supply head 33 of die supply device 12 up and down integrally with stage 32 on which wafer pallet 27 is set is provided, and in cases in which die 22 is inverted and then mounted on circuit board 17, as shown in FIG. 7, die 22 on inverted supply head 33 is picked up by mounting head 15 of component mounter 11 at a position in which supply head 33 and stage 32 have been lowered by the up-down moving mechanism.

Figure 8:
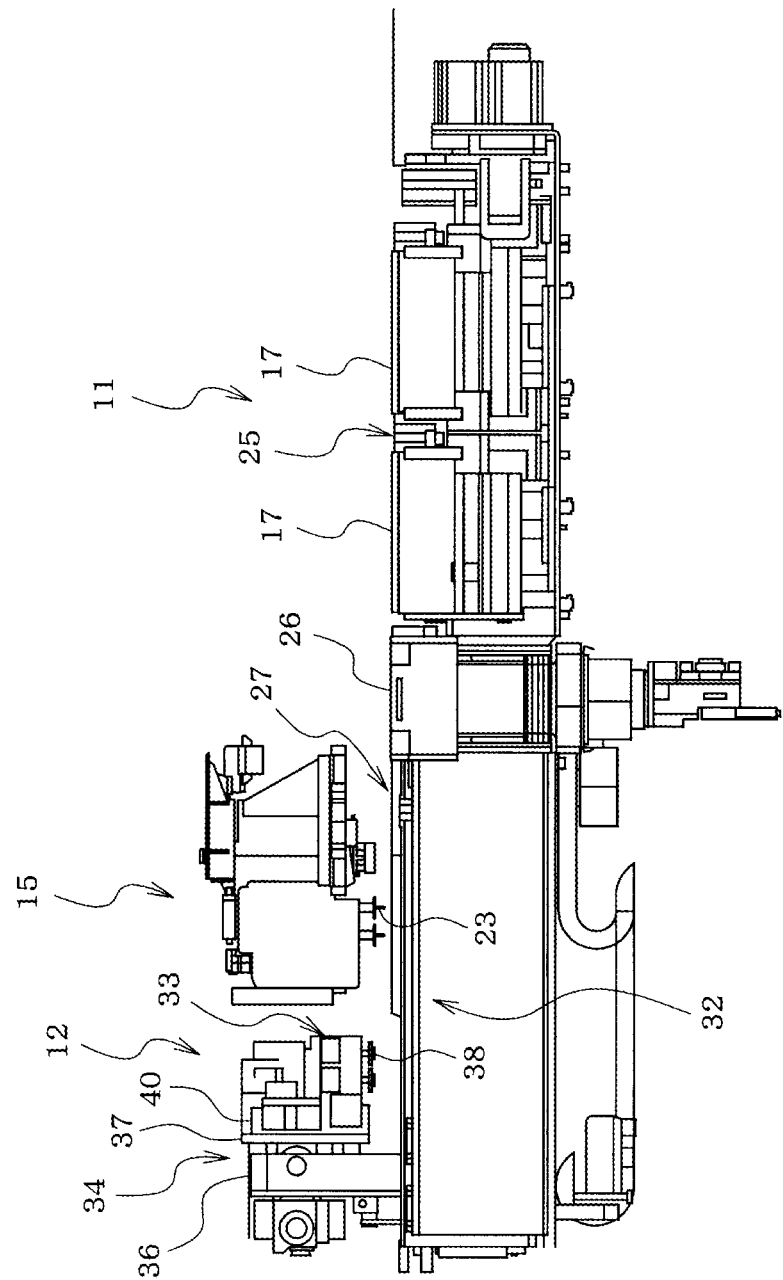
FIG. 8 is a side view showing the state when the mounting head of the component mounter directly picks up dies from a wafer pallet on the stage of the die supply device.

Meanwhile, when die 22 is attached on dicing sheet 29 of wafer pallet 27 with the mounting surface facing downward, die 22 is mounted on circuit board 17 without being vertically inverted. In this case, as shown in FIG. 8, die 22 of wafer pallet 27 on stage 32 is picked up by suction nozzle 23 of mounting head 15 of the component mounter 11 at a position in which supply head 33 and stage 32 have been raised by the up-down moving mechanism.

Supply head 33 of die supply device 12 is provided with camera 41 (refer to FIG. 9) that images die 22 before the die 22 is picked up by suction nozzle 38 of supply head 33; an image captured by camera 41 is processed to recognize the position of die 22, and then die 22 is picked up by suction nozzle 38 of supply head 33.

Also, die supply device 12 is provided with pushup mechanism 42 (refer to FIG. 12) that pushes up a portion of dicing sheet 29 that is to be picked up by suction nozzle 38 from below when die 22 is picked up by suction nozzle 38 of supply head 33. Pushup mechanism 42 moves up and down in association with the up-down movement of stage 32.

While component mounter 11 is operating, a control system (not shown) controls operations of component mounter 11, die supply device 12, and the feeder in accordance with a production job (a production program) such that any one of dies 22 supplied from die supply device 12 and the feeder components supplied from the feeder is picked up and mounted on circuit board 17.

Figure 5:
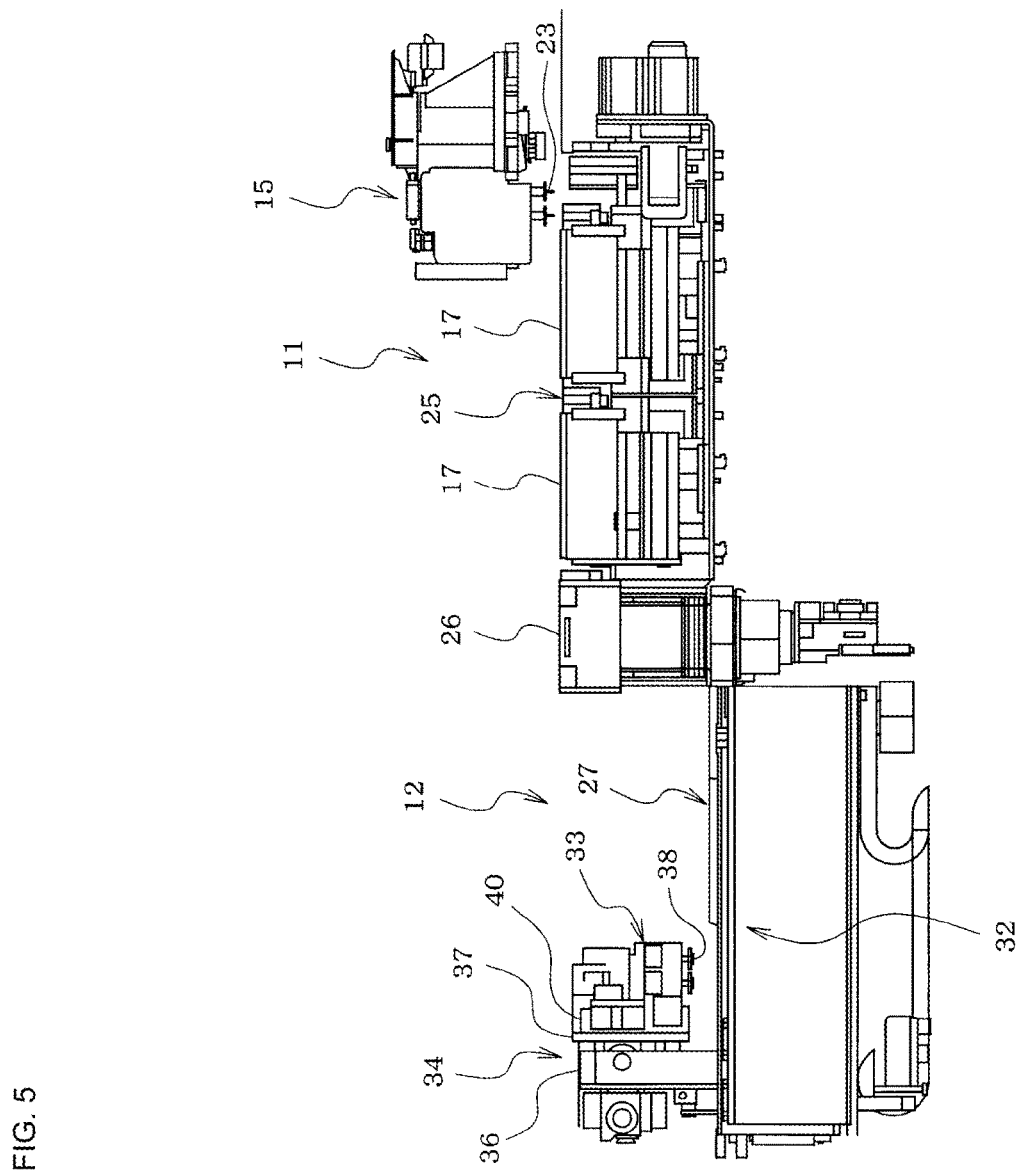
FIG. 5 is a side view showing the height positional relationship between the mounting head of the component mounter and the supply head when the stage of the die supply device is lowered.
Figure 6:
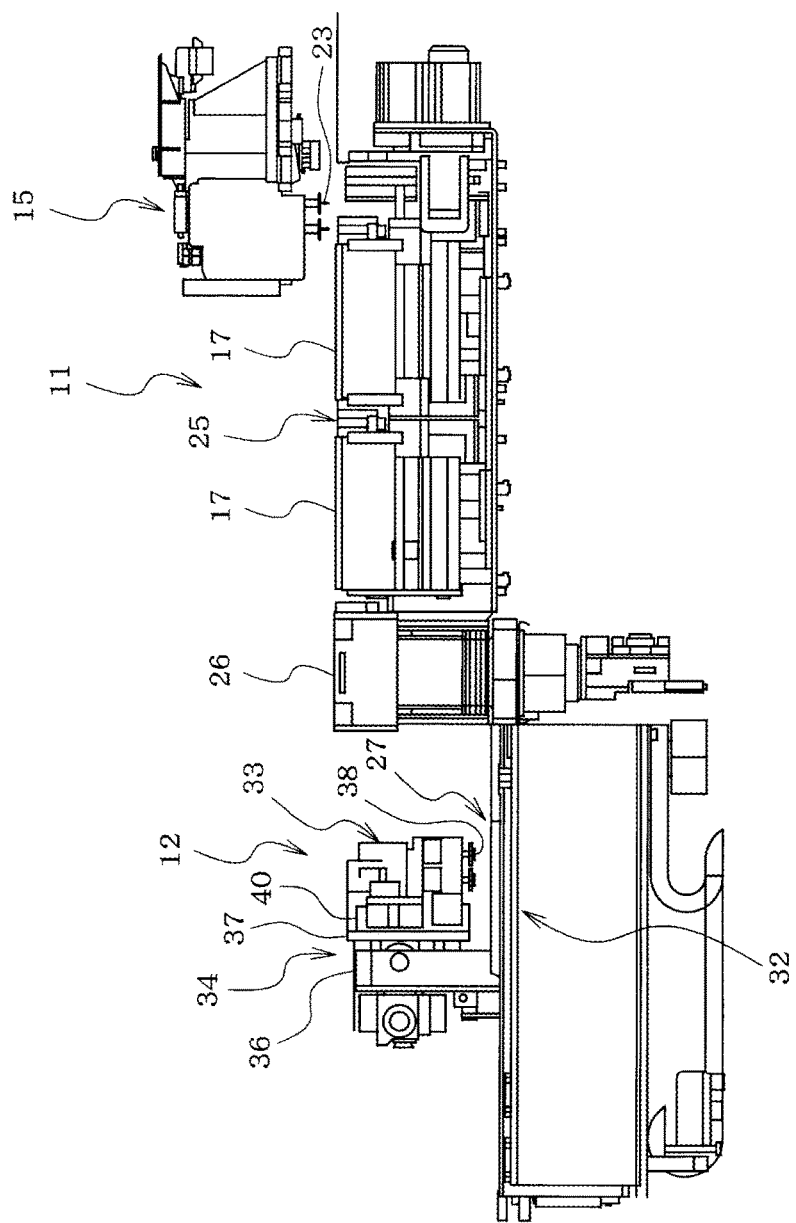
FIG. 6 is a side view showing the state when dies on a wafer pallet on the stage of the die supply device are picked up by the supply head.

Here, in a case in which die 22 is inverted and then mounted on circuit board 17, as shown in FIG. 5, supply head 33 of die supply device 12 and stage 32 are lowered, and as shown in FIG. 6, supply head 33 is moved above wafer pallet 27, then, before the die 22 is picked up by supply head 33, camera 41 images the die 22 so as to recognize the position of the die 22, then the die 22 is picked up by suction nozzle 38 of supply head 33. Next, as shown in FIG. 7, supply head 33 of die supply device 12 is inverted together with suction nozzle 38 such that die 22 held by suction nozzle 38 is inverted, mounting head 15 of component mounter 11 is moved to be positioned above supply head 33, then, the die 22 on suction nozzle 38 of supply head 33 is picked up by suction nozzle 23 of mounting head 15 and is mounted on circuit board 17.

However, when comparing the time required, after the completion of die transfer operation of picking up a die 22 held by supply head 33 of die supply device 12 with mounting head 15 of component mounter 11, for die transfer preparation operation of inverting supply head 33 of die supply device 12 to its original state, moving supply head 33 above wafer pallet 27, imaging a die 22 which is to be a pickup target with camera 41 and recognizing the position the die 22, picking up the die 22, vertically inverting again, and moving to the next die transfer position, and the time required, after the completion of die transfer operation, for die mounting operation of moving mounting head 15 of component mounter 11 above the die mounting position on circuit board 17, mounting the die 22 on circuit board 17, and moving mounting head 15 to the next die transfer position, the two times are not the same, so a waiting time (Ta−Tb) arises during which the head that arrives at the next die transfer position earlier must wait for the other head to arrive. Also, because the cycle time is decided by the total of the time taken for die transfer operation (time taken for die transfer operation is taken as a fixed time) and the longer of the time Ta required for die transfer preparation operation of die supply device 12 and the time Tb required for die mounting operation of component mounter 11 (=shorter time+waiting time), in order to shorten cycle time and improve productivity, it is necessary to shorten the longer time or the waiting time.

Thus, with the present embodiment, the control system (the control device of die supply device 12 and/or the control device of component mounter 11), by performing the die transfer position determining program shown in FIG. 16 and described further below each time die transfer operation is completed, determines the next die transfer position such that the longer of the time Ta required for die transfer preparation operation of die supply device 12 and the time Tb required for die mounting operation of component mounter 11 is made shorter, the difference between the two times smaller (this corresponds to the waiting time at the die transfer position), thus shortening the cycle time.

Figure 14:
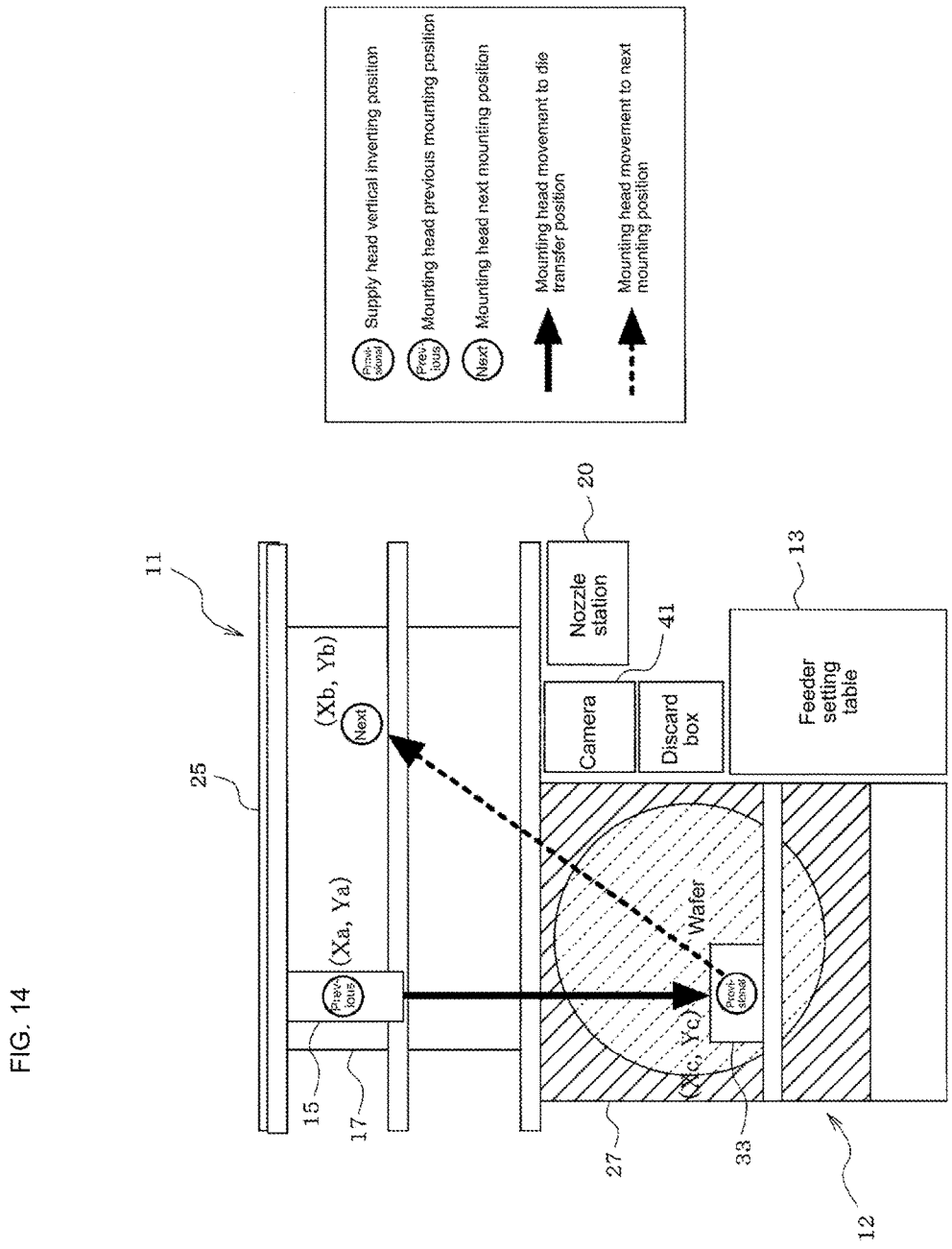
FIG. 14 is a plan view to illustrate the method for calculating the waiting time of the supply head at the vertical inverting position (die pickup position) of the supply head.
Figure 15:
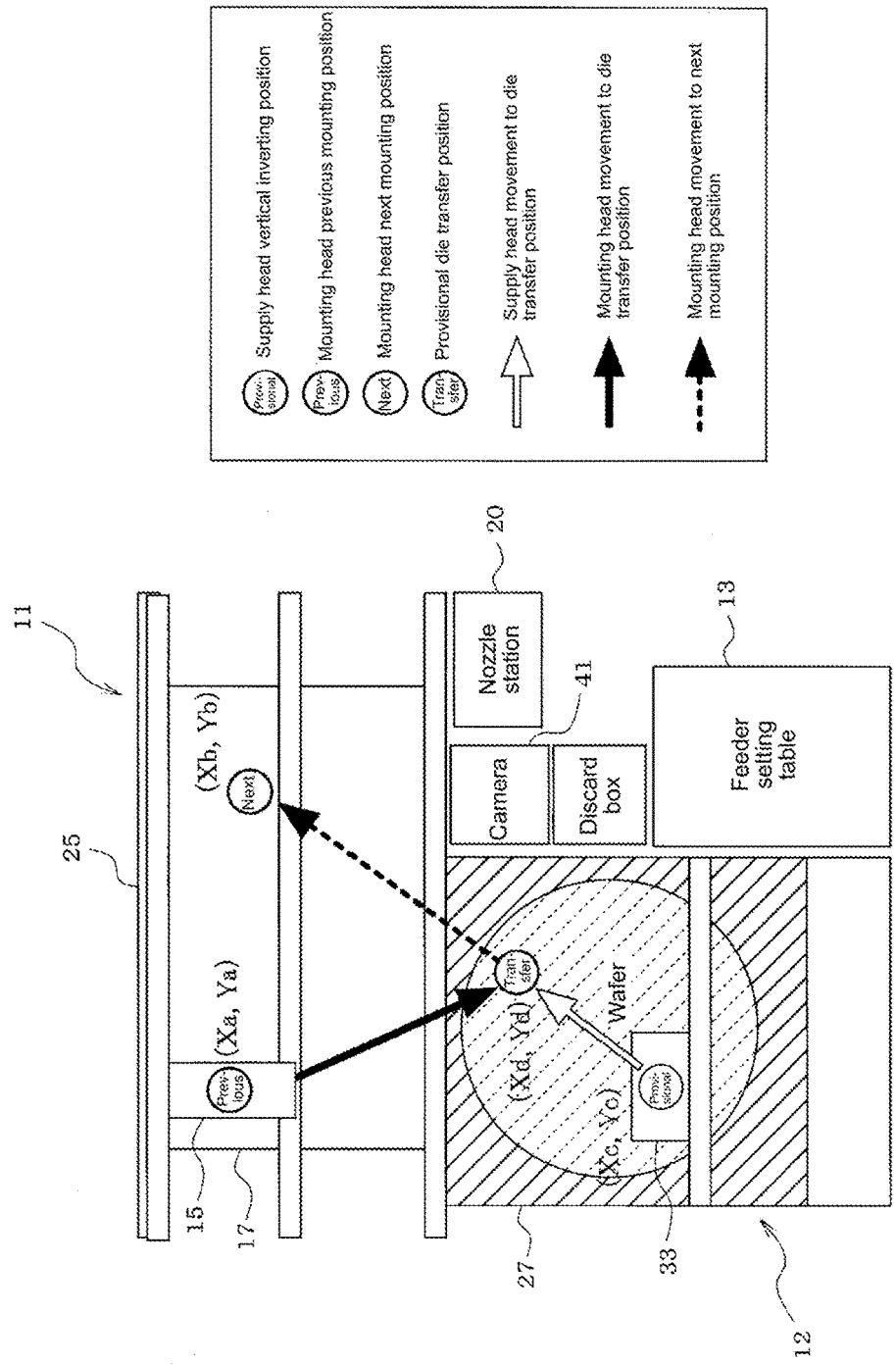
FIG. 15 is a plan to illustrate the method for calculating the waiting time of the supply head at a provisional die transfer position.

The method for determining the die transfer position in the present embodiment is described below using FIGS. 14 and 15. In FIGS. 14 and 15, (Xa, Ya) is the previous mounting position of mounting head 15 of component mounter 11, (Xb, Yb) is the next mounting position of mounting head 15 of component mounter 11, (Xc, Yc) is the vertical inverting position of supply head 33 of die supply device 12, and (Xd, Yd) is a provisional die transfer position. The next die transfer position is determined by the following steps, [1] to [6]. Note that, as with the present embodiment, in a case in which multiple suction nozzles 38 are provided on supply head 33 of die supply device 12 and multiple dies 22 picked up by one supply head 33, the previous mounting position of mounting head 15 (Xa, Ya) is the mounting position where the final die 22 was mounted, and the next mounting position of mounting head 15 is the mounting position where the first die 22 is mounted.

[1] Waiting time Tn for which supply head 33 is at the vertical inverting position is calculated by the following formula.

$$Tn = Ta - (Tb + A\_C/Va)$$ (Formula 1)

Here, Ta is the time required for die transfer preparation operation of die supply device 12, Tb is the time required for die mounting operation of component mounter 11, A_C is the distance between the previous mounting position of mounting head 15 (Xa, Ya) and the vertical inverting position of supply head 33 (Xc, Yc), and Va is the average movement speed of mounting head 15 prior to picking up dies.

[2] Movement time Tm of mounting head 15 from the vertical inverting position of supply head 33 to the next mounting position is calculated by the following formula.

$$Tm = C\_B/Vb \quad \text{(Formula 2)}$$

Here, C_B is the distance between the vertical inverting position of supply head 33 (Xc, Yc) and the next mounting position (Xb, Yb), and Vb is the average moving speed of mounting head 15 after picking up dies.

[3] Waiting time Tp at the provisional die transfer position is calculated by the following formula.

$$Tp = (Ta + C\_D/Vc) - (Tb + A\_D/Va) \quad \text{(Formula 3)}$$

Here, C_D is the distance between the vertical inverting position of supply head 33 (Xc, Yc) and the provisional die transfer position (Xd, Yd), and Vc is the average moving speed of supply head 33 after picking up dies. A_D is the distance between the previous mounting position of mounting head 15 (Xa, Ya) and the provisional die transfer position (Xd, Yd), and Va is the average moving speed of mounting head 15 before picking up dies.

[4] Movement time Tq of mounting head 15 from the provisional die transfer position to the next mounting position is calculated by the following formula.

$$Tq = D\_B/Vb \quad \text{(Formula 4)}$$

Here, D_B is the distance between the provisional die transfer position (Xd, Yd) and the next mounting position (Xb, Yb), and Vb is the average moving speed of mounting head 15 after picking up dies.

Note that, the moving speed of supply head 33 and the moving speed of mounting head 15 are not necessarily the same. Conventionally, there are many cases in which the moving speed of mounting head 15 is faster than that of supply head 33. Also, there are cases in which the average moving speed Vb of mounting head 15 after picking up dies is slower than the average moving speed of supply head 33 such that picked up dies 22 do not fall off.

[5] Improvement time Tz in a case when die transfer operation is performed at the provisional die transfer position is calculated by the formulas below. In a case in which Tn>Tp, because the waiting time of supply head 33 is decreased and the movement amount of mounting head 15 to the next mounting position is increased, improvement time Tz is calculated by the following formula.

$$Tz = (Tq - Tb) - (Tn - Tq) \quad \text{(Formula 5.1)}$$

Here, (Tq−Tb) corresponds to the increase in movement time, and (Tn−Tq) corresponds to the decrease in waiting time.

In a case in which Tn<Tp, because the waiting time of supply head 33 is increased and the movement amount of mounting head 15 to the next mounting position is decreased, improvement time Tz is calculated by the following formula.

$$Tz = (Tp - Tn) - (Tq - Tb) \quad \text{(Formula 5.2)}$$

Here, (Tp−Tn) corresponds to the increase in waiting time, and (Tq−Tb) corresponds to the decrease in movement time.

[6] Multiple provisional die transfer positions are prepared as candidates for the next die transfer position and improvement time Tz is calculated for each of the provisional die transfer positions, and the provisional die transfer position for which improvement time Tz is maximized is determined as the next die transfer position. Note that, for the setting method for the provisional die transfer positions, in order to decrease the movement amount of supply head 33 and the movement amount of mounting head 15, the provisional die transfer positions may be set as a position on a straight line connecting the vertical inverting position of supply head 33 (Xc, Yc) and the next mounting position (Xb, Yb), or a position close to that line.

Figure 16:
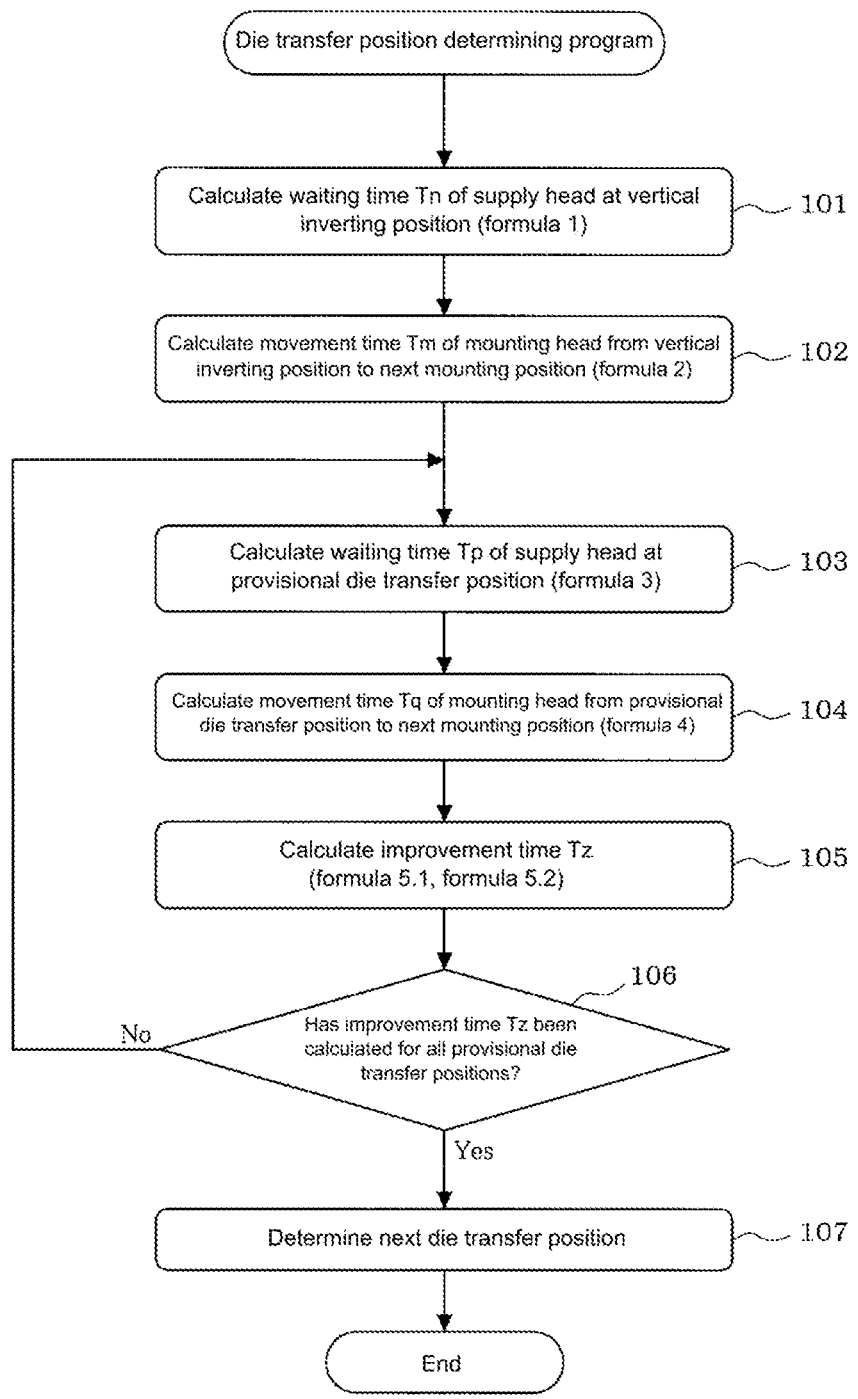
FIG. 16 is a flow chart showing the processing flow of the die transfer position determining program.

Determining the die transfer position in the embodiment as described above is performed by the control system (the control device of die supply device 12 and/or the control device of component mounter 11) according to the die transfer position determining program of FIG. 16. The die transfer position determining program of FIG. 16 is performed each time die transfer operation is completed. When this program is run, first, in step 101, waiting time Tn for which supply head 33 is at the vertical inverting position is calculated using formula 1. Then, continuing to step 102, movement time Tm of mounting head 15 from the vertical inverting position of supply head 33 to the next mounting position is calculated using formula 2.

Then, continuing to step 103, waiting time Tp at the provisional die transfer position is calculated using formula 3. Then, continuing to step 104, movement time Tq of mounting head 15 from the provisional die transfer position to the next mounting position is calculated using formula 4. Then, continuing to step 105, improvement time Tz is calculated using formula 5.1 or formula 5.2.

Then, continuing to step 106, it is determined whether improvement time Tz has been calculated for all of the prepared provisional die transfer positions; if there is a provisional die transfer position for which improvement time Tz has not yet been calculated, processing of steps 103 to 105 above is performed to calculate improvement time Tz for that provisional die transfer position.

When calculation of improvement time Tz for each provisional die transfer position has been calculated for all of the provisional die transfer positions, processing continues to step 107, improvement times Tz for each of the provisional die transfer positions are compared, the provisional die transfer position for which improvement time Tz is maximized is selected and determined as the next die transfer position. By this, the next die transfer position is decided each time die transfer operation is completed.

According to the embodiment described above, because improvement time Tz is calculated for each of the multiple prepared provisional die transfer positions, and the provisional die transfer position for which improvement time Tz is maximized is determined as the next die transfer position, the cycle time is shortened, thus improving productivity.

Note that, although die transfer preparation operation of die supply device 12 includes supply head 33 movement, die pickup operation, die imaging and image processing, and vertical inverting operation, the time required for die pickup operation of supply head 33, die imaging and image processing, vertical inverting operation can be taken as a fixed time that is independent of the die transfer position, therefore the time Ta required for die transfer preparation operation of die supply device 12 is correlated with supply head 33 movement time. Thus, supply head 33 movement time may be used as representative information of time Ta required for die transfer preparation operation of die supply device 12.

Also, although die mounting operation of component mounter 11 includes mounting head 15 movement and vertical inverting at the mounting position, the time required for vertical motion at the mounting position can be taken as a fixed time that is independent of the die transfer position, therefore the time Tb required for die mounting operation of component mounter 11 is correlated with mounting head 15 movement time. Thus, mounting head 15 movement time may be used as representative information of the time required for die mounting operation of component mounter 11.

Note that, the present disclosure is not limited to the embodiment described above and it goes without saying that various embodiments with changes that do not extend beyond the scope of the disclosure are possible, such as that only a single suction nozzle 38 may be provided on supply head 33 of die supply device 12 such that only a single die 22 is picked up, and suitable changes may be made to the configuration of component mounter 11 or die supply device 12.

REFERENCE SIGNS LIST

11: component mounter; 12: die supply device; 13: feeder setting table; 15: mounting head; 16: XY moving mechanism; 17: circuit board; 22: die; 23: suction nozzle; 25: conveyor; 26: part camera; 27: wafer pallet; 28: magazine; 29: dicing sheet; 32: stage; 33: supply head; 34: supply head moving mechanism; 35: pallet pulling out and returning mechanism; 38: suction nozzle; 39: vertical inverting mechanism; 40: head holding unit; 41: camera; 42: pushup mechanism

The invention claimed is:

1. A die mounting system comprising:
a die supply device that supplies dies formed from a single diced wafer affixed to a dicing sheet and that is set on a component mounter, the die supply device including:
a supply head that picks up a die from the dicing sheet and is then vertically inverted, and
a supply head moving mechanism that moves the supply head;
a mounting head of the component mounter that picks up a die supplied from the die supply device and mounts the die on a circuit board; and
a control system configured to control movement of both the supply head and the mounting head in a controls operation where the supply head is moved above the die which is to be a pickup target by the supply head moving mechanism, the die is picked up by the supply head, the supply head is vertically inverted, the supply head is moved to a die transfer position by the supply head moving mechanism, and the die held by the supply head is picked up by the mounting head of the component mounter at the die transfer position and mounted on a circuit board,
wherein the control system is configured to set a next die transfer position and to move both the supply head and the mounting head to the next die transfer position to shorten a cycle time by shortening the longer of two times and reducing the time difference of the two times, the two times being:
the time required, after the completion of die transfer operation of picking up a die held by the supply head of the die supply device with the mounting head of the component mounter at the die transfer position, for die transfer preparation operation of inverting the supply head of the die supply device to its original state and moving the supply head above a die which is to be the pickup target, picking up the die, vertically inverting again, and moving to the next die transfer position, and
the time required, after the completion of die transfer operation, for die mounting operation of moving the mounting head of the component mounter above the die mounting position on the circuit board, mounting the die on the circuit board, and moving the mounting head to the next die transfer position.

2. The die mounting system according to claim 1, wherein the control system uses the movement time of the supply head as representative information of the time required for die transfer preparation operation of the die supply device, and the movement time of the mounting head as representative information of the time required for die mounting operation of the component mounter.

3. The die mounting system according to claim 1, wherein the control system prepares multiple provisional die transfer positions that are candidates for the next die transfer position, calculates, under each of the provisional die transfer positions, the time required for die transfer preparation operation of the die supply device or information equivalent to that, and the time required for die mounting operation of the component mounter or information equivalent to that, and decides the next die transfer position as the provisional die transfer position that results in the shortest cycle time.

4. A die mounting method including
a die supply device that supplies dies formed from a single diced wafer affixed to a dicing sheet and that is set on a component mounter, the die supply device including:
a supply head that picks up a die from the dicing sheet and is then vertically inverted, and
a supply head moving mechanism that moves the supply head; and
a mounting head of the component mounter that picks up a die supplied from the die supply device and mounts the die on a circuit board, the die mounting method comprising:
controlling movement of both the supply head and the mounting head in an operation where the supply head is moved above the die which is to be a pickup target by the supply head moving mechanism, the die is picked up by the supply head, the supply head is vertically inverted, the supply head is moved to a die transfer position by the supply head moving mechanism, and the die held by the supply head is picked up by the mounting head of the component mounter at the transfer position and mounted on a circuit board, and
setting a next die transfer position and moving both the supply head and the mounting head to the next die transfer position to shorten a cycle time by shortening the longer of two times and reducing the time difference of the two times, the two times being:
the time required, after the completion of die transfer operation of picking up a die held by the supply head of the die supply device with the mounting head of the component mounter at the die transfer position, for die transfer preparation operation of inverting the supply head of the die supply device to its original state and moving the supply head above a die which is to be the pickup target, picking up the die, vertically inverting again, and moving to the next die transfer position, and
the time required, after the completion of die transfer operation, for die mounting operation of moving the mounting head of the component mounter above the die mounting position on the circuit board, mounting the die on the circuit board, and moving the mounting head to the next die transfer position.

5. The die mounting method according to claim 4, wherein
the movement time of the supply head is used as representative information of the time required for die transfer preparation operation of the die supply device, and the movement time of the mounting head is used as representative information of the time required for die mounting operation of the component mounter.

* * * * *